United States Patent
Suvorov et al.

(10) Patent No.: US 7,875,537 B2
(45) Date of Patent: Jan. 25, 2011

(54) HIGH TEMPERATURE ION IMPLANTATION OF NITRIDE BASED HEMTS

(75) Inventors: Alexander Suvorov, Durham, NC (US); Scott T. Sheppard, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 570 days.

(21) Appl. No.: 11/846,605

(22) Filed: Aug. 29, 2007

(65) Prior Publication Data

US 2009/0057718 A1 Mar. 5, 2009

(51) Int. Cl.
*H01L 21/265* (2006.01)

(52) U.S. Cl. .................. 438/522; 438/473; 438/604

(58) Field of Classification Search .............. 438/369, 438/473, 506, 518, 522, 523, 604
See application file for complete search history.

(56) References Cited

U.S. PATENT DOCUMENTS

| | | | |
|---|---|---|---|
| 5,866,925 A * | 2/1999 | Zolper et al. ............... 257/279 |
| 6,316,793 B1 | 11/2001 | Sheppard et al. | |
| 6,486,502 B1 | 11/2002 | Sheppard et al. | |
| 6,534,801 B2 * | 3/2003 | Yoshida ..................... 257/192 |
| 6,583,454 B2 | 6/2003 | Sheppard et al. | |
| 6,849,882 B2 | 2/2005 | Chavarkar et al. | |
| 7,112,860 B2 | 9/2006 | Saxler | |
| 7,230,284 B2 | 6/2007 | Parikh et al. | |
| 7,236,053 B2 | 6/2007 | Pribble et al. | |
| 7,253,454 B2 | 8/2007 | Saxler | |
| 2001/0017370 A1 | 8/2001 | Sheppard et al. | |
| 2003/0020092 A1 * | 1/2003 | Parikh et al. ................ 257/192 |
| 2003/0201459 A1 | 10/2003 | Sheppard et al. | |
| 2004/0021152 A1 * | 2/2004 | Nguyen et al. ............... 257/192 |
| 2004/0041169 A1 * | 3/2004 | Ren et al. .................... 257/192 |
| 2004/0144991 A1 * | 7/2004 | Kikkawa ..................... 257/103 |
| 2004/0173816 A1 | 9/2004 | Saxler | |
| 2005/0133818 A1 * | 6/2005 | Johnson et al. ............. 257/192 |
| 2005/0258451 A1 | 11/2005 | Saxler et al. | |
| 2006/0006414 A1 * | 1/2006 | Germain et al. ............. 257/192 |
| 2006/0118823 A1 | 6/2006 | Parikh et al. | |
| 2006/0197109 A1 | 9/2006 | Saxler | |
| 2006/0214188 A1 * | 9/2006 | Kawasaki et al. ........... 257/194 |

(Continued)

OTHER PUBLICATIONS

Yu et al., Dopant activation and ultralow resistance ohmic contacts to Si-ion-implanted GaN using pressurized rapid therma annealing, Applied Physics Letters, vol. 85, No. 22, 2004, pp. 5254-5256.*

(Continued)

*Primary Examiner*—David Vu
*Assistant Examiner*—Earl N Taylor
(74) *Attorney, Agent, or Firm*—Withrow & Terranova, P.L.L.C.

(57) ABSTRACT

A method is disclosed for forming a high electron mobility transistor. The method includes the steps of implanting a Group III nitride layer at a defined position with ions that when implanted produce an improved ohmic contact between the layer and contact metals, with the implantation being carried out at a temperature higher than room temperature and hot enough to reduce the amount of damage done to the Group III nitride layer, but below a temperature at which surface problems causing leakage at the gate or epitaxial layer dissociation would occur. An ohmic contact selected from the group consisting of titanium, aluminum, nickel and alloys thereof is added to the implanted defined position on the Group III nitride layer.

24 Claims, 5 Drawing Sheets

U.S. PATENT DOCUMENTS

| | | | | |
|---|---|---|---|---|
| 2006/0226442 | A1* | 10/2006 | Zhang et al. | 257/192 |
| 2007/0018198 | A1 | 1/2007 | Brandes et al. | |
| 2007/0018199 | A1 | 1/2007 | Sheppard et al. | |
| 2007/0018210 | A1 | 1/2007 | Sheppard et al. | |
| 2007/0138506 | A1* | 6/2007 | Braddock | 257/192 |
| 2007/0158683 | A1* | 7/2007 | Sheppard et al. | 257/183 |
| 2007/0164321 | A1* | 7/2007 | Sheppard et al. | 257/256 |
| 2007/0228416 | A1* | 10/2007 | Chen et al. | 257/192 |
| 2007/0268071 | A1 | 11/2007 | Pribble et al. | |
| 2007/0269968 | A1* | 11/2007 | Saxler et al. | 438/522 |
| 2007/0278518 | A1* | 12/2007 | Chen et al. | 257/192 |
| 2008/0023727 | A1* | 1/2008 | Hoshi et al. | 257/194 |
| 2008/0121895 | A1* | 5/2008 | Sheppard et al. | 257/76 |

OTHER PUBLICATIONS

Furuhashi et al., Electrical properties of n-type layers formed in GaN by Si implantation, Nuclear Instruments and Methods in Physics Research B, 242, 2006, pp. 633-636.*

Pearton et al., Implantation temperature dependance of Si activation in AlGaN, Applied Physics Letters, 88, 182106, 2006, pp. 1-3.*

Cho et al., Improvement of AlGaN/GaN Heterostructure Field Effect Transistor Characteristics by Using Two-Step Ohmic Contact Process, Japanese Journal of Applied Physics, vol. 42, 2003, pp. 2209-2312.*

Cao et. al., Implanted p-n junctions in GaN, Solid-State Electronics, 43, 1999, pp. 1235-1238.*

Wang et al., AlGaN/GaN high electron mobility transistors with implanted ohmic contacts, Thin Solid Films, 515, 2006, pp. 4476-4479.*

Recht et al., Nonalloyed ohmic contacts in AlGaN/GaN HEMTs by ion implantation with reduced activation annealing temperature, IEEE Electron Device Letters, vol. 27, No. 4, 2006, pp. 205-207.*

Kocan et al., Characterization of Non-Alloyed Ohmic Contacts to Si-Implanted AlGaN/GaN Heterostructures for High-Electron Mobility Transistors, Journal of Electronic Materials, vol. 36, No. 9, Jul. 2007, pp. 1156-1159.*

Kumar et al., Thermally-stable low-resistance Ti/Al/Mo/Au multilayer ohmic contacts on n-GaN, Journal of Applied Physics, vol. 92, No. 3, 2002, pp. 1712-1714.*

Denbaars S. et al: "Ion Implanted AlGaN-GaN HEMTs with Nonalloyed Ohmic Contacts," IEEE Electronic Device Letters, New York, NY; vol. 26, No. 5; May 1, 2005; pp. 283-285.

Irokawa Y. et al: "Electrical Characteristics of GaN Implanted with Si+ at Elevated Temperatures," Applied Physics Letters, AIP, American Institute of Physics, Melville, NY, vol. 86, No. 11; Mar. 9, 2005, pp. 112108-1-112108-3.

Eiting C. J. et al: "Activation Studies of Low-dose Si Implants in Gallium Nitride," Applied Physics Letters, AIP, American Institute of Physics, Melville, NY, vol. 73, No. 26, Dec. 28, 1998; pp. 3875-3877.

International Search Report of foreign counterpart application PCT/US2008/067608; mailed Oct. 13, 2008; 2 pages.

* cited by examiner

HIGH TEMPERATURE ION IMPLANTATION OF NITRIDE BASED HEMTS

STATEMENT OF GOVERNMENT INTEREST

This invention was developed, at least in part, under DARPA Contract No. 4400121759. The Government may have certain rights in this invention.

BACKGROUND

The present invention relates to semiconductor devices and, more particularly, to Group-III nitride based high electron mobility transistors (HEMTs).

HEMTs are semiconductor devices that can be used for a variety of applications including microwave and millimeter-wave communications, radar, radio astronomy, cell phones, direct broadcast satellite receivers, and electronic warfare systems.

Traditional semiconductors usually require a conductive layer that is doped with n-type impurities to generate free electrons; however, the electrons within the layer tend to collide with these impurities, which slows them down. HEMTs are field effect transistors that utilize the heterojunction between two materials having different bandgaps to form a conductive channel rather than a doped region. HEMTs typically do not require impurities to form the conductive layer and therefore allow for higher electron mobility.

HEMTs are regularly fabricated from semiconductor materials such as silicon (Si) and gallium arsenide (GaAs). Si has a low electron mobility, which generates a high source resistance; therefore, Si semiconductor materials may not be well suited for high power, high frequency, and high temperature applications.

Signal amplification devices in radar, cellular, and satellite communications frequently use GaAs based HEMTs. GaAs semiconductor materials have higher electron mobility and a lower source resistance than Si, which allows them to operate at higher frequencies. GaAs has, however, a relatively small bandgap preventing the use of GaAs HEMTs in high power at high frequency applications.

Improvements in the manufacturing of gallium nitride (GaN) semi-conductor materials and semi-conductor materials made from an alloy consisting of aluminum nitride and gallium nitride (AlGaN) have focused interest on the use of AlGaN/GaN HEMTs for use in high frequency, high power and high temperature applications. AlGaN and GaN have large bandgaps making them superior to Si and GaAs for these types of applications.

The use of AlGaN layered upon GaN and the mismatch of the crystal structures of the two materials and their different bandgap energies results in the creation of a two-dimensional electron gas (2DEG) under certain circumstances. The 2DEG layer accumulates in the smaller bandgap material and contains a very high electron concentration. Electrons originating in the wider-bandgap material transfer to the 2DEG allowing for a higher electron mobility.

The combination of high electron concentration and high electron mobility gives AlGaN/GaN HEMTs greater performance than metal-semiconductor field effect transistors (MESFETs) for high-frequency applications.

One method of fabricating an AlGaN/GaN HEMT includes forming a layer of GaN on a substrate (typically silicon carbide (SiC)), forming a thin layer of AlGaN on the GaN layer, and providing ohmic contacts and a gate contact on the AlGaN layer.

Traditionally an alloy of titanium (Ti), aluminum (Al), nickel (Ni), and gold (Au) forms the ohmic contacts. In order to function as an electronic contact the alloy must be ohmic towards the 2DEG layer rather than the AlGaN layer on which it is placed. The addition of Au to this alloy enables the contacts to be ohmic towards the 2DEG; however, the Au also gives the alloy bad morphology.

Another method of forming low-resistive ohmic contacts on AlGaN/GaN HEMTs generally well-understood within the art employs ion implantation at the ohmic contact region. Implantation in this manner allows the use of a Ti/Ni/Al contact, thus eliminating the poor morphology created by the use of Au.

Nevertheless, this implantation process creates another problem because of the high doses of implantation ions that must be used in order to get sufficient activation rates within the implanted regions. The high doses of implantation ions create large amounts of crystal destruction. This destruction can be corrected by annealing the device; however, SiC and AlGaN are difficult to recrystallize by annealing. In order to recrystallize SiC and AlGaN properly, longer annealing times can be used. Longer anneal times, however, damage other features of the device.

Therefore, there is a need for an implantation process that uses high doses of ions and creates less damage to the implanted crystal thus requiring less annealing.

SUMMARY

In one aspect, the invention is a method of forming a high electron mobility transistor. The method includes implanting a Group III nitride layer at a defined position with ions that when implanted produce an improved ohmic contact between the layer and contact metals.

Implantation is carried out at a temperature higher than room temperature and hot enough to reduce the amount of damage done to the Group III nitride layer, but below a temperature at which surface problems causing leakage at the gate or epitaxial layer dissociation would occur. An ohmic contact is added to the implanted defined position on the Group III nitride layer.

In another aspect the method includes carrying out the implantation with an ion beam current high enough to successfully implant ions within the Group III nitride layer, but below a current that would melt or destroy the Group III nitride layer and at a temperature higher than room temperature and hot enough to reduce the amount of damage done to the Group III nitride layer, but below a temperature at which surface problems causing leakage at the gate or epitaxial layer dissociation would occur.

In yet another aspect, the invention is a transistor precursor that includes a growth substrate selected from the group consisting of silicon carbide and sapphire, a layer of gallium nitride on the growth substrate, a layer of aluminum gallium nitride on the gallium nitride layer for generating a two dimensional electron gas at the interface between the layers when a current is applied in a HEMT orientation and defined implanted regions in the aluminum gallium nitride and gallium nitride layers for improving the ohmic characteristics of the layers when an ohmic metal is added to the defined implanted regions, with the defined implanted regions of the transistor precursor having a temperature of between about 250° and 900° C.

The foregoing and other objects and advantages of the invention and the manner in which the same are accomplished will become clearer based on the followed detailed description taken in conjunction with the accompanying drawings.

DETAILED DESCRIPTION

Figure 1:
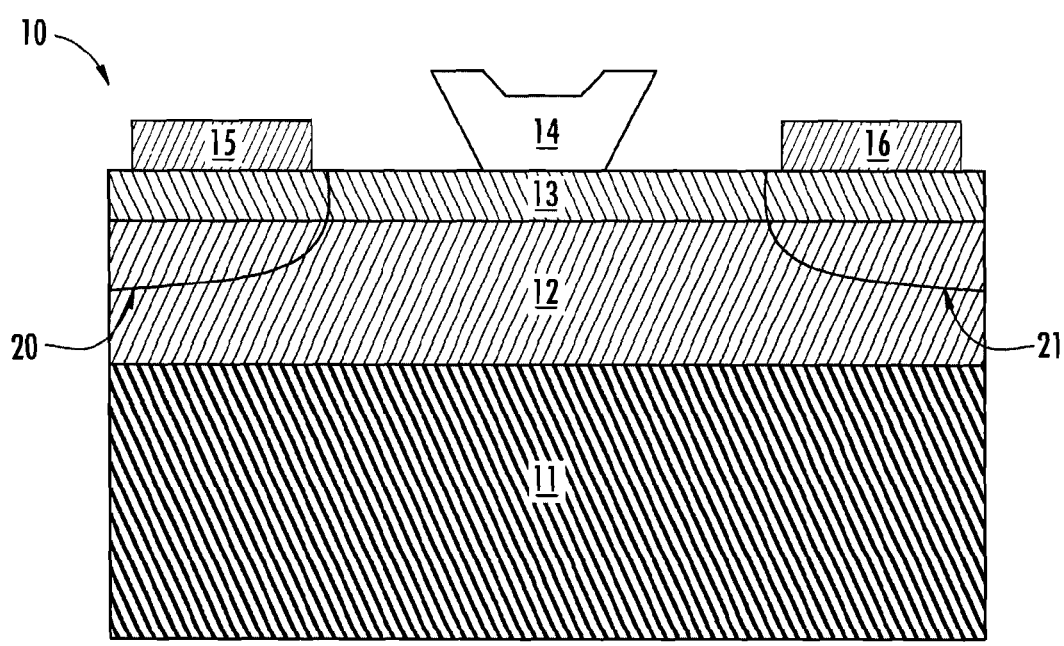
FIG. 1 is a schematic cross-sectional view of an AlGaN/GaN HEMT according to an embodiment of the present invention.

FIG. 1 illustrates a schematic cross-section of an AlGaN/GaN based HEMT 10 constructed in accordance with an embodiment of the present invention. The HEMT includes a substrate 11 formed from materials generally well-understood within the art (e.g., silicon carbide (SiC) or sapphire ($Al_2O_3$)). A GaN layer 12 is provided on the substrate 11. The HEMT 10 includes an AlGaN layer 13 provided on top of the GaN layer 12.

Preferably, SiC forms the substrate 11. The crystal lattice structure of SiC matches more closely to the Group-III nitrides than sapphire, resulting in higher quality Group-III nitride films. Furthermore, SiC has a very high thermal conductivity which allows for higher total output power of the device.

The AlGaN layer 13 has a wider bandgap than the GaN layer 12 which results in a free charge transfer from the AlGaN layer 13 to the GaN layer 12. Charge accumulates at the interface of the AlGaN layer 13 and the GaN layer 12 forming a two-dimensional electron gas (2DEG) (not shown). The 2DEG has very high electron mobility resulting in a HEMT 10 with very high transconductance at high frequencies. The voltage applied to the gate 14 controls the electron flow in the 2DEG under the gate 14, allowing for control over the total electron flow. Preferably, the gate 14 is a Schottky gate.

The source contact 15 and drain contact 16 provided on the AlGaN layer 13 are preferably formed of alloys of titanium (Ti), aluminum (Al), and nickel (Ni). Traditional alloys used for ohmic contacts 15 and 16 are formed of Ti, Al, Ni as well as gold (Au). The addition of Au gives the alloy poor morphology, so the contacts 15 and 16 of the present invention preferably do not include Au. Other candidate compositions for the ohmic contact include titanium-tungsten-nitride (Ti—W—N), titanium-nitride (Ti—N), molybdenum (Mo) and molybdenum silicides.

High temperature ion implantation using a high ion beam current of an n-type dopant creates the implanted regions 20 and 21. Preferably, the dopant ions are $Si^+$. These implanted regions 20 and 21 allow the contacts 15 and 16 to be ohmic towards the 2DEG.

High temperature as used herein should be understood to include temperatures that are below a temperature at which surface problems causing leakage at the gate 14 or epitaxial layer dissociation would occur but higher than room temperature. Preferably, the temperature at which implantation occurs is between about 250° C. and 900° C.

High ion beam current as used herein should be understood to include a beam current below that which would melt or destroy the crystal, but high enough to successfully implant ions within the AlGaN and GaN layers 13 and 12. Preferably, the beam current is between 30 μA and 130 μA.

In one embodiment, the present invention is an AlGaN/GaN HEMT wherein implanted regions 20 and 21 have been implanted at a temperature of 650° C. using an ion beam current of 40 μA.

In another embodiment, the present invention is an AlGaN/GaN HEMT wherein implanted regions 20 and 21 have been implanted at a temperature of 650° C. using an ion beam current of 120 μA.

In a third embodiment, the present invention is an AlGaN/GaN HEMT wherein implanted regions 20 and 21 have been implanted at a temperature of 350° C. using an ion beam current of 40 μA.

In a fourth embodiment, the present invention is an AlGaN/GaN HEMT wherein implanted regions 20 and 21 have been implanted at a temperature of 350° C. using an ion beam current of 120 μA.

Figure 2:
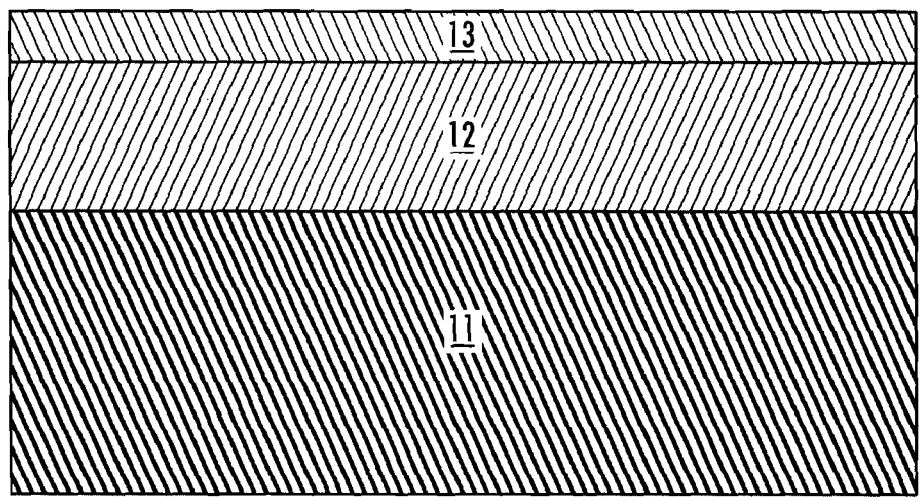
FIGS. 2-4 illustrate a process for fabricating the AlGaN/GaN HEMT of FIG. 1 according to one embodiment.

The present invention also includes methods for fabricating HEMTs using high temperature ion implantation. U.S. Pat. No. 7,230,284 discloses a method for forming the GaN layer 12 on the substrate 11 and forming the AlGaN layer 13 on the GaN layer 12 as illustrated in FIG. 2.

Figure 3A:
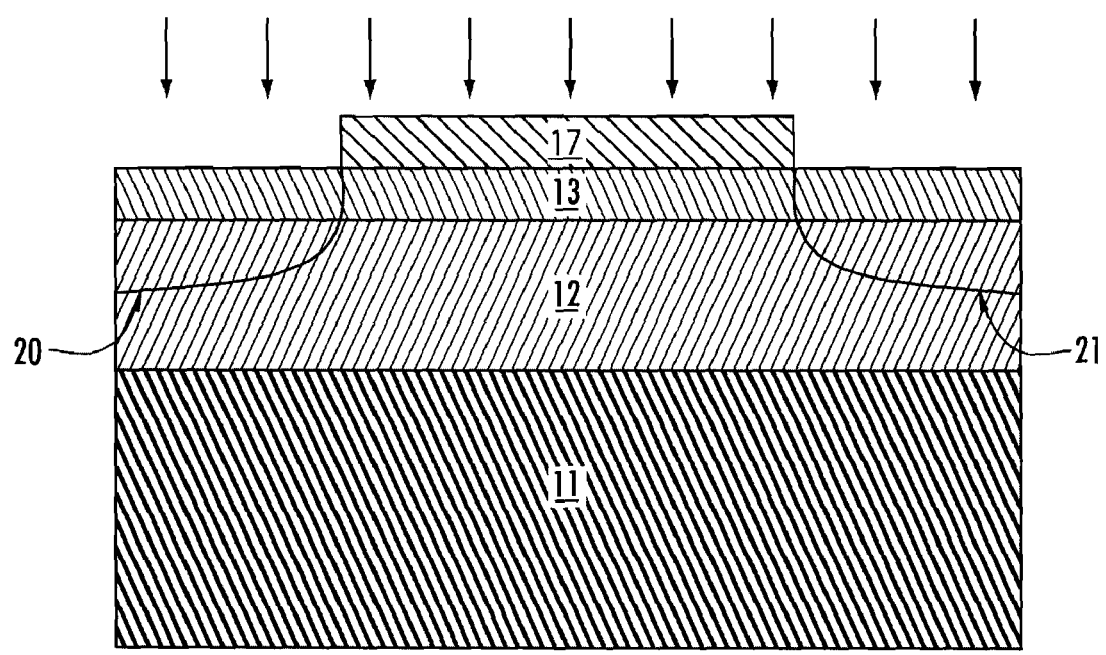

As illustrated in FIG. 3A, a mask layer 17 protects only the portion of the AlGaN layer that will not be implanted leaving the crystal exposed in the regions to be implanted. The mask layer 17 is a material capable of withstanding the conditions of the high temperature, high ion beam current implantation without otherwise adversely affecting either the implantation step or the device. For example, the mask layer 17 may be formed of an oxide.

The device is then maintained at a high temperature and a high current beam implants n-type dopant ions (e.g. $Si^+$ ions) through the AlGaN layer 13 into the GaN layer 12 to form implanted regions 20 and 21. The ions are implanted to a depth that allows the ohmic contacts 15 and 16 to act ohmic towards the 2DEG.

Figure 3B:
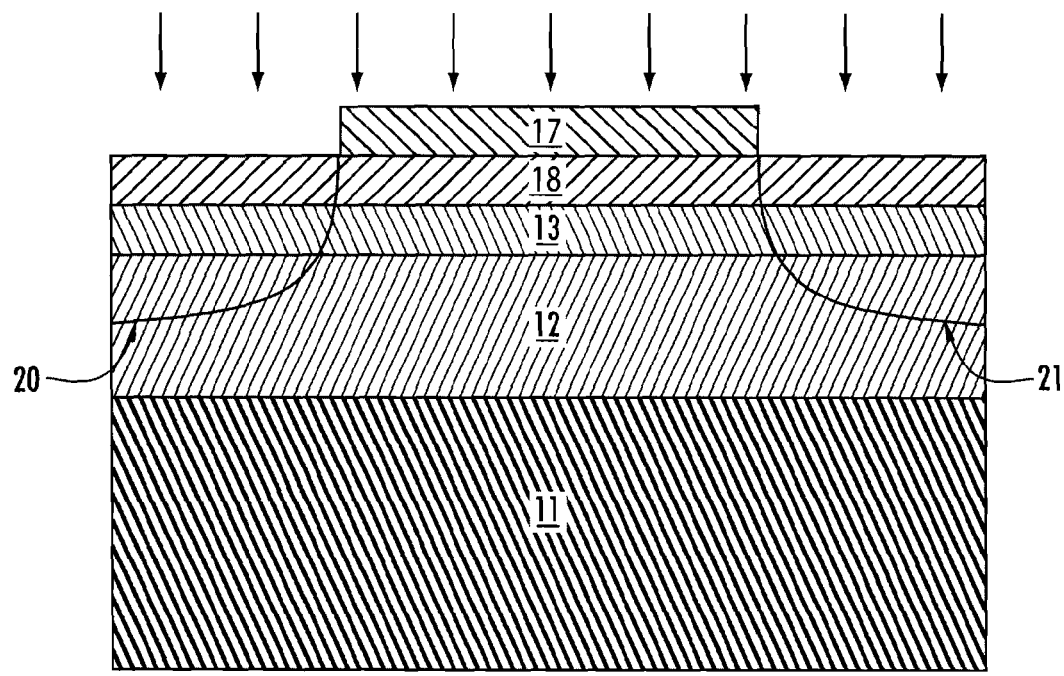

As illustrated in FIG. 3B, in a particular embodiment of this method, a protective layer 18 may be placed over the regions to be implanted. In a more particular embodiment, silicon nitride ($Si_3N_4$) is the protective layer 18. The protective layer 18 reduces the amount of damage to the AlGaN layer created by the ion beam. The use of a protective layer 18 is preferred because AlGaN can be particularly difficult to recrystallize using annealing methods.

After implantation, an annealing process improves the damaged implanted regions 20 and 21. Shorter anneal times are desired because the anneal has the potential to damage other parts of the device. Implantation at high temperature results in less damage to the implanted regions and therefore allows shorter anneal times, which reduces the possibility for anneal-based secondary damage.

Figure 4:
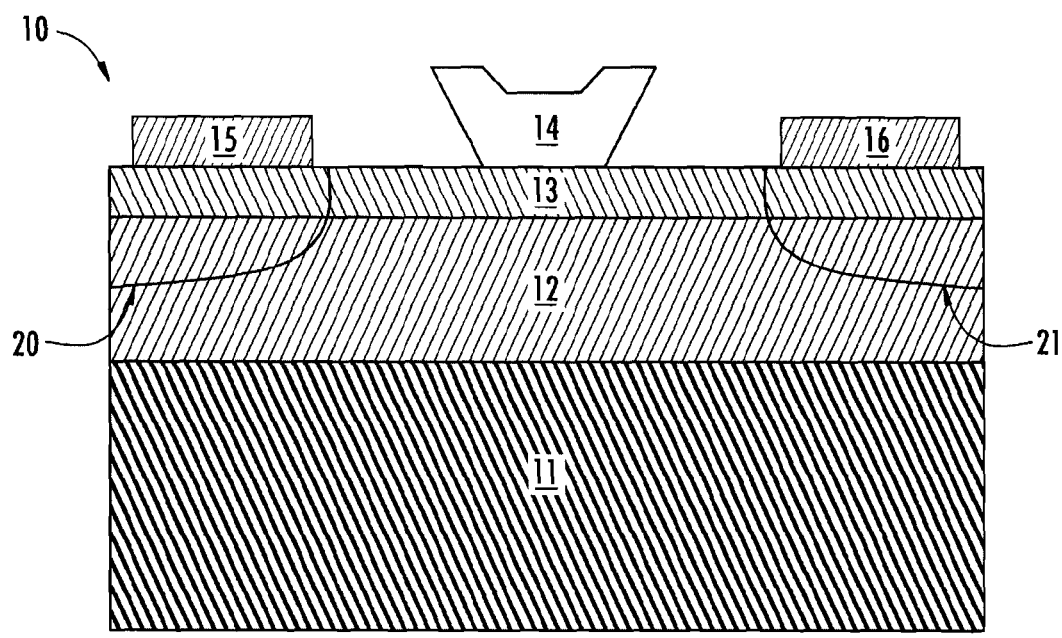

As illustrated in FIG. 4, ohmic contacts 15 and 16 are then formed on the AlGaN layer 13 over the implanted regions 20 and 21. The ohmic contacts 15 and 16 connect with the 2DEG electronically through the implanted regions 20 and 21. Preferably, an alloy of Ti, Ni, and Al forms the ohmic contacts 15 and 16.

A gate 14 can be formed on the AlGaN layer 13 over the 2DEG. The voltage applied to the gate 14 controls the electron flow in the 2DEG, allowing for control over the total electron flow. Preferably, the gate 14 is a Schottky gate.

Figure 5:
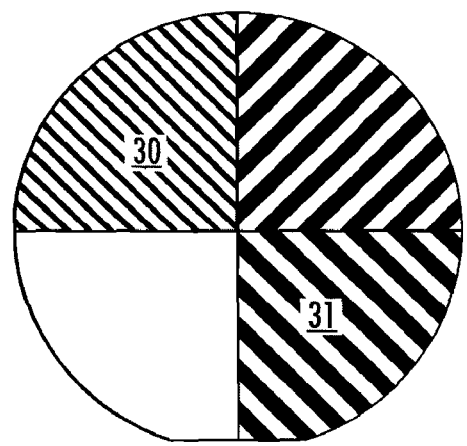
FIGS. 5-7 illustrate three gallium nitride wafers implanted with silicon ions under different conditions.
Figure 6:
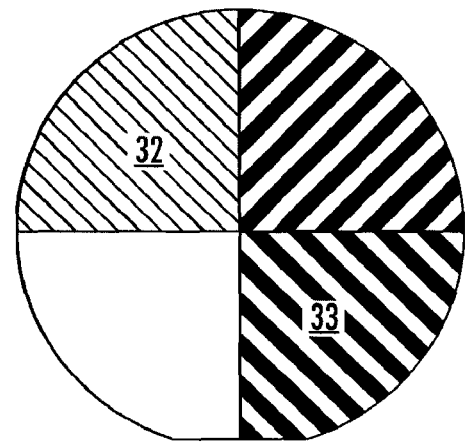
Figure 7:
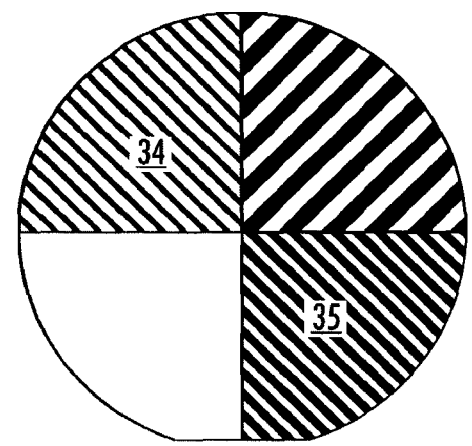

Each wafer in FIGS. 5-7 is GaN that has been implanted with $Si^+$ ions. FIGS. 5-7 illustrate that conducting the implantation step of this method at high temperature avoids damaging the implanted crystals as much as implantation at room temperature. In FIGS. 5-7, the lighter shades indicate more light passage based upon less crystal damage, while darker shades indicate less light passage resulting from more crystal damage.

In FIG. 5, the top left quarter of the wafer 30 has been implanted using an ion beam current of 120 μA at a temperature of 350° C. The bottom right quarter of the wafer 31 has been implanted using an ion beam current of 120 μA at room temperature. The top left quarter 30 is significantly lighter than the bottom right quarter 31, indicating significantly less damage because of the higher temperature during implantation.

Similarly, in FIG. 6, the top left quarter of the wafer 32 has been implanted using an ion beam current of 120 μA at a temperature of 650° C. The bottom right quarter of the wafer 33 has been implanted using an ion beam current of 120 μA at room temperature. The top left quarter 32 is significantly lighter than the bottom right quarter 33, indicating significantly less damage because of the higher temperature during implantation.

A comparison of the top left quarter of the wafer 30 in FIG. 5 and the top left quarter of the wafer 32 in FIG. 6 also indicates that implantation at higher temperatures decreases the amount of crystal damage created by the implantation process.

The use of a high current ion beam provides two distinct advantages over a lower current ion beam. Using a high current ion beam reduces the time it takes to implant a given dose of dopant ions therefore reducing costs. Additionally, the use of a high current ion beam further increases the temperature of the wafer during implantation, resulting in less damage to the implanted crystal.

The wafer in FIG. 7 illustrates the second advantage of using a higher current ion beam. In FIG. 7 the top left quarter of the wafer 34 has been implanted using an ion beam current of 120 μA at a temperature of 350° C. The bottom right quarter of the wafer 35 has been implanted using an ion beam current of 40 μA at a temperature of 350° C. The top left quarter 34 is significantly lighter than the bottom right quarter 35, indicating significantly less damage because of the higher ion beam current during implantation. Some of the reduced damage in the top left quarter 34 may be attributable to the fact that it was effectively annealed at 350° C. while the bottom right quarter of the wafer 35 was being implanted. The difference in clarity created by the anneal is believed to be less significant than the difference in clarity created by the higher ion beam current.

Figure 8:
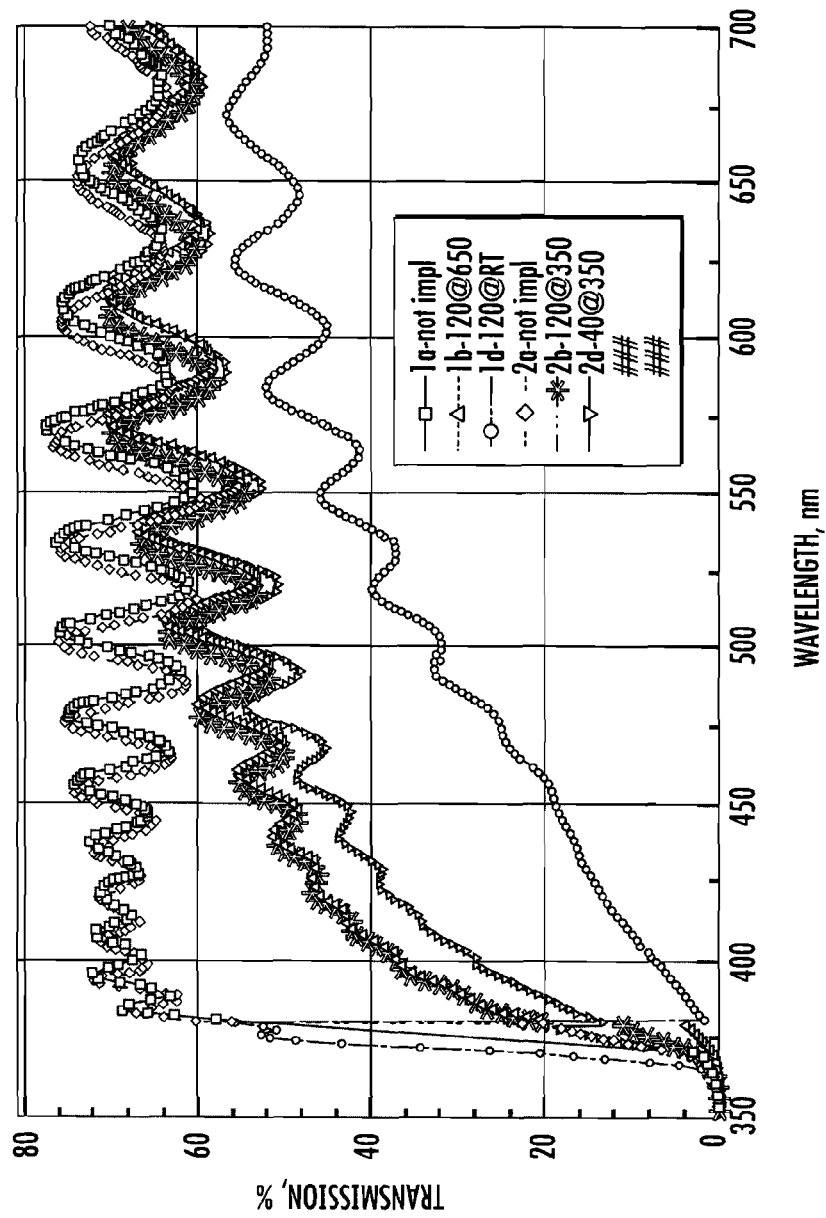
FIG. 8 depicts the transmission spectrums in the visible range of wafers implanted with silicon ions under various conditions.

FIG. 8 illustrates the previously mentioned lightness and darkness comparisons in a more concrete manner. The graph plots the percentage of light transmitted through GaN wafers that have been implanted with $Si^+$ versus the wavelength of the light for the visible range.

The two highest plots, one formed of squares and the other of diamonds, indicate the transmission percentages of two GaN wafers that have not been implanted. As shown in FIG. 8, these unimplanted wafers transmit the highest percentage of visible light.

The lowest plot, formed of downward pointing triangles indicates the transmission percentage of a GaN wafer implanted with $Si^+$ at room temperature with an ion beam current of 120 μA over the visible range. As shown in FIG. 8, this wafer transmits the lowest percentage of visible light.

The mid-level plot formed of circles indicates the transmission percentage of a GaN wafer implanted with $Si^+$ at a temperature of 650° C. with an ion beam current of 120 μA over the visible range. The mid-level plot formed of diamonds indicates the transmission percentage of a GaN wafer implanted with $Si^+$ at a temperature of 350° C. with an ion beam current of 120 μA over the visible range. The mid-level plot formed of downward pointing triangles indicates the transmission percentage of a GaN wafer implanted with $Si^+$ at a temperature of 350° C. with an ion beam current of 40 μA over the visible range. These three mid-level plots indicate the transmission spectrums of three different wafers that are embodiments of the present invention. As shown in FIG. 8, these three wafers transmit more light over the visible range than the wafer implanted at room temperature. FIG. 8 also indicates that these three wafers transmit less light over the visible range than the unimplanted wafers.

It should also be noted that the mid-level plot formed of diamonds (i.e., the wafer implanted at 350° C. with a current of 120 μA) has higher values over the visible range than the mid-level plot formed of downward pointing triangles (i.e, the wafer implanted at 350° C. with a current of 40 μA). This comparison indicates that wafers implanted at higher beam currents typically transmit a greater percentage of light than wafers implanted at lower beam currents.

The plots show that implantation at high temperatures (e.g., the three mid-level plots) produces a wafer that transmits a much higher percentage of visible light than implantation at room temperature (e.g., the lowest plot). The transmission percentage correlates with less damage to the crystal structure of the wafer. Therefore, implantation at high temperatures creates less damage to the crystal structure of the wafer than implantation at room temperature.

The plot also shows that a wafer implanted using a higher ion beam current (e.g., the mid-level plot formed of diamonds) transmits a higher percentage of visible light than a wafer implanted using a lower ion beam current (e.g., the mid-level plot formed of downward pointing triangles). Once again, the transmission percentage correlates with less damage to the crystal structure of the wafer. Therefore, implantation using higher ion beam currents creates less damage to the crystal structure of the wafer than implantation at lower ion beam currents.

The method of the present invention produces HEMTs with significantly less damage to the crystal than previously disclosed methods. As a result, HEMTs produced using the method of the present invention perform superiorly to prior HEMTs.

The following table contains data on the performance of a HEMT device implanted at room temperature and a HEMT device implanted at high temperature in accordance with the present invention:

| Implant Temperature | RF Power (GHz) | Gate-Source Voltage | Drain-Source Voltage | Current (mA/mm) | Gain | Output Power | Power Added Efficiency | Average On-Resistance | Drain Source Current |
|---|---|---|---|---|---|---|---|---|---|
| 350° C. | 10 | −2.8 | 48 | 43.0 | 13.7 | 9.13 | 51.6 | 3.54 | 1007.8 |
| Room Temperature | 10 | −2.8 | 48 | 43.0 | 11.7 | 8.42 | 48.4 | 3.90 | 936.4 |

The wafers of the table received the same implant dose of $1.00\times10^{16}$ atoms/cm$^2$ of Si$^+$ and the same temperature anneal (1080° C.). The data shows that both wafers were supplied with the same RF power, gate-source voltage, drain-source voltage, and current. The high temperature implanted HEMT had a higher gain, output power, power added efficiency and drain source current as well as a lower average on-resistance. This data indicates that devices formed according to the present invention have better device performance than devices formed using ion implantation at room temperature.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A method of forming a high electron mobility transistor comprising:
   implanting a Group III nitride layer at a defined position with ions to provide an ion-implanted region, the implantation being carried out at a temperature between 250° C. and 900° C.; and
   adding a contact over the ion-implanted region to thereby form an ohmic contact.

2. A method according to claim 1 wherein the contact is formed of a metal selected from a group consisting of titanium, aluminum, nickel and alloys thereof.

3. A method according to claim 1 wherein the contact is formed of a material selected from a group consisting of titanium-tungsten-nitride, titanium-nitride, molybdenum and molybdenum silicides.

4. A method of forming a high electron mobility transistor according to claim 1 wherein the implantation is carried out at a temperature of at least 350° C.

5. A method of forming a high electron mobility transistor according to claim 1 wherein the implantation is carried out at a temperature of at least 650° C.

6. A method of forming a high electron mobility transistor according to claim 1 wherein the implantation is carried out at a temperature of at least 800° C.

7. A method of forming a high electron mobility transistor according to claim 1 wherein the implantation is carried out with an ion beam current between about 30 μA and 130 μA.

8. A method of forming a high electron mobility transistor according to claim 1 wherein the implantation is carried out with an ion beam current of about 40 μA.

9. A method of forming a high electron mobility transistor according to claim 8 wherein the implantation is carried out at a temperature of at least 350° C.

10. A method of forming a high electron mobility transistor according to claim 8 wherein the implantation is carried out at a temperature of at least 650° C.

11. A method of forming a high electron mobility transistor according to claim 1 wherein the implantation is carried out with an ion beam current of about 120 μA.

12. A method of forming a high electron mobility transistor according to claim 11 wherein the implantation is carried out at a temperature of at least 350° C.

13. A method of forming a high electron mobility transistor according to claim 11 wherein the implantation is carried out at a temperature of at least 650° C.

14. A method of forming a high electron mobility transistor according to claim 1 wherein the contact is comprised of an alloy of titanium, aluminum and nickel.

15. A method of forming a high electron mobility transistor according to claim 1 wherein implanting the Group III nitride layer at the defined position with ions to provide the ion-implanted region comprises implanting the Group III nitride layer at the defined position with ions through a protective layer placed on top of the Group III nitride layer to reduce the amount of damage to the Group III nitride layer.

16. A method of forming a high electron mobility transistor according to claim 15 wherein the protective layer is a silicon nitride protective layer.

17. A method of forming a high electron mobility transistor according to claim 1 comprising placing a mask layer on the Group III nitride layer before the step of implanting to prevent implantation at positions other than the defined position.

18. A method of forming a high electron mobility transistor according to claim 17 wherein the mask layer is an oxide mask layer.

19. A method of forming a high electron mobility transistor comprising:
    placing a protective layer on a Group III nitride layer;
    implanting the Group III nitride layer through the protective layer at a defined position with ions to provide an ion-implanted region, the implantation being carried out with an ion beam current between about 30 μA and 130 μA; and
    adding an ohmic contact over the ion-implanted region.

20. A method of forming a high electron mobility transistor according to claim 19 wherein the protective layer is a silicon nitride protective layer.

21. A method of forming a high electron mobility transistor according to claim 19 wherein the implantation of the Group III nitride layer with ions is carried out at a temperature of between about 250° C. and 900° C.

22. A method of forming a high electron mobility transistor according to claim 19 wherein the contact is comprised of an alloy of titanium, aluminum and nickel.

23. A method of forming a high electron mobility transistor according to claim 1 wherein:
    the high electron mobility transistor comprises a GaN layer and the Group III nitride layer is an AlGaN layer formed on the GaN layer;
    implanting the Group III nitride layer comprises implanting the AlGaN layer at the defined position with ions to provide the ion-implanted region such that the ion-implanted region extends through the AlGaN layer into the GaN layer; and
    adding the contact comprises adding the contact over the ion-implanted region to thereby form the ohmic contact to a 2-DEG formed at an interface of the GaN layer and the AlGaN layer.

24. A method of forming a high electron mobility transistor according to claim 19 wherein:
    the high electron mobility transistor comprises a GaN layer and the Group III nitride layer is an AlGaN layer formed on the GaN layer;
    implanting the Group III nitride layer comprises implanting the AlGaN layer at the defined position with ions to provide the ion-implanted region such that the ion-implanted region extends through the AlGaN layer into the GaN layer; and
    adding the contact comprises adding the contact over the ion-implanted region to thereby form the ohmic contact to a 2-DEG formed at an interface of the GaN layer and the AlGaN layer.

* * * * *